US005510630A

United States Patent [19]

Agarwal et al.

[11] Patent Number: 5,510,630
[45] Date of Patent: Apr. 23, 1996

[54] NON-VOLATILE RANDOM ACCESS MEMORY CELL CONSTRUCTED OF SILICON CARBIDE

[75] Inventors: Anant K. Agarwal, Monroeville; Richard R. Siergiej, Irwin; Charles D. Brandt, Mt. Lebanon; Marvin H. White, Bethlehem, all of Pa.

[73] Assignee: Westinghouse Electric Corporation, Pittsburgh, Pa.

[21] Appl. No.: 138,908

[22] Filed: Oct. 18, 1993

[51] Int. Cl.$^6$ .............................. H01L 29/04; H01L 29/48
[52] U.S. Cl. .............................. 257/77; 257/296; 257/306; 257/402
[58] Field of Search .............................. 257/77, 310, 402, 257/296, 301, 306, 311, 532

[56] References Cited

U.S. PATENT DOCUMENTS

| | | | |
|---|---|---|---|
| 2,854,364 | 9/1958 | Lely | 317/204 |
| 4,185,319 | 1/1980 | Stewart | 365/185 |
| 4,402,126 | 9/1983 | Chapman | 29/571 |
| 4,757,028 | 7/1988 | Kondoh et al. | 437/40 |
| 4,791,611 | 12/1988 | Eldin et al. | 365/177 |
| 4,875,083 | 10/1989 | Palmour | 357/23.6 |
| 4,897,710 | 1/1990 | Suzuki et al. | 357/71 |
| 4,918,498 | 4/1990 | Plus et al. | 357/23.7 |
| 5,109,357 | 4/1992 | Eaton, Jr. | 365/145 |
| 5,124,779 | 6/1992 | Farakawa et al. | 357/67 |
| 5,177,572 | 1/1993 | Murakami | 257/260 |
| 5,216,264 | 6/1993 | Fujii et al. | 257/289 |

FOREIGN PATENT DOCUMENTS

| | | | |
|---|---|---|---|
| 2756915 | 7/1978 | Germany | 257/402 |
| WO93/11540 | 6/1993 | WIPO . | |

OTHER PUBLICATIONS

"The Potential of Diamond and SiC Electronic Devices for Microwave and Millimeter–Wave Power Applications" by R. Trew, J. B. Yan, P. Mock, Proceedings of the IEEE, vol. 79, No. 5, May 1991.

"Thin Film Deposition and Microelectronic and Optoelectronic Device Fabrication and Characterization in Monocrystalline Alpha and Beta Silicon Carbide" by R. Davis, G. Kelner, M. Shur, J. Palmour, J. Edmond, Proceedings of the IEEE, vol. 79, No. 5, May 1991.

*Primary Examiner*—Donald L. Monin, Jr.

[57] ABSTRACT

A non-volatile random access memory (NVRAM) cell that utilizes a simple, single-transistor DRAM cell configuration. The present NVRAM employs an enhancement mode nMOS transistor made as an accumulation mode transistor. The transistor has an n-type silicon carbide channel layer on a p-type silicon carbide buffer layer, with the channel and buffer layers being on a highly resistive silicon carbide substrate. The transistor also has n+ source and drain contact regions on the channel layer. A polysilicon/oxide/metal capacitor is preferably used which has a very low leakage current. Furthermore, this type of capacitor can be stacked on top of the transistor to save area and achieve high cell density. It is preferred to use a non-reentrant (edgeless) gate transistor structure to further reduce edge effects.

24 Claims, 5 Drawing Sheets

5,510,630

NON-VOLATILE RANDOM ACCESS MEMORY CELL CONSTRUCTED OF SILICON CARBIDE

BACKGROUND OF THE INVENTION

1. Field of the Invention

The present invention relates generally to semiconductor memory cells and more particularly to nonvolatile random access memory cells fabricated of silicon carbide.

2. Description of the Prior Art

Memory comes in three basic forms (1) dynamic storage in which data must be constantly refreshed and in which data are erased when power is no longer applied to the cell; (2) non-volatile memory in which data remains permanently in the cell even when power is not applied; and (3) static memory which does not need to be refreshed but which loses its data when power is no longer applied to the cell. The type of memory chosen depends on the performance requirements of the memory cell. Density is important to the system due to cost, size, and performance considerations. The delay along signal lines comprises much of the delay in modern high speed computers. Smaller, denser components allow for the use of shorter signal lines and therefore improve performance. Also, the smaller the memory cell, the less expensive the integrated memory chip and the less expensive the overall memory system.

Dynamic random access memory cells (DRAM) are well known in the industry and are typically constructed of a single transistor and a single storage capacitor. Metal oxide semiconductor field effect transistor dynamic random access memory (MOSFET DRAM) is currently the dominant main memory technology. MOSFET DRAMs are chosen primarily for their characteristics of low cost, low power, and moderate performance; DRAMs achieve their low cost through use of a relatively simple semiconductor technology (CMOS) and a small memory cell consisting of the single transistor and the single storage capacitor. The CMOS technology provides both n-channel and p-channel field effect transistors. The equivalent circuit of a typical DRAM circuit cell is shown in FIG. 1.

The DRAM stores information as a charge in the storage capacitor which is coupled through the source drain path of the transistor to a bit line. The gate path of the transistor is then coupled to a word line. When the word and bit lines are simultaneously addressed (brought to a high voltage), the access transistor is turned on and charge is transferred into the storage capacitor if it had no charge initially (stored "zero"), or little charge is transferred to the storage capacitor if it were fully charged initially (stored "one"). The amount of charge that the bit line must supply to the storage capacitor is measured by the sensing circuitry, and this information is used to interpret whether a "zero" or "one" had been stored in the cell. The sense circuity then restores full charge in the capacitor if it had been there originally, or fully depletes the capacitor if little charge had existed originally.

Thus, the charge in the storage capacitor must be refreshed repetitively due to destructive readout of the memory charge as well as from leakage currents both from the capacitor and from the transistor. Edge effects are one way in which leakage currents occur. Edge effects are when one is not able to shut off the transistor properly and therefore there is still some residual current conduction through the transistor along the edges of the transistor. Typically, the memory contents are refreshed about every 2 ms. The refresh operation is accomplished through special control circuits built into the memory cell array. The refresh operation prohibits full usage of the memory because a given amount of time is required to periodically refresh all the memory cells. In the event of a power failure, the memory cells cannot be refreshed and therefore the information in the memory is lost.

At present, a true non-volatile random access memory with long term retention, unlimited cycling and fast read/write capabilities are not readily available. Thus, in many applications, battery backed SRAM or a DRAM is employed. If the application does not demand many read/write cycles, an EPROM or an EEPROM may be used. EPROMS and EEPROMS have very slow write speed and limited cycling capability. Battery backed SRAMs or DRAMs require bulky battery packs. Magnetic Storage is not only bulky but also has inherent reliability problems as any mechanical system with rotating parts. In addition, none of the aforementioned memory types can operate above 200° C.

Silicon carbide is a wide energy bandgap semiconductor (approximately 3 eV), and is thus an attractive material for the fabrication of integrated circuitry. Silicon carbide offers high saturated electron velocity (approximately $2.0 \times 10^7$ cm/s), and high breakdown electric field (approximately $2 \times 10^6$ V/cm), and high thermal conductivity (approximately 5 W/cm $-°C$.). In addition, the energy bandgap and thus the maximum operating temperature range of silicon carbide is at least twice that of conventional semiconductors.

Historically, n-channel MOSFETs fabricated of conventional semiconductor materials such as silicon have been made by ion implanting n-type source and drain regions in a p-type substrate. The industry has been unable to apply this technology to silicon carbide to produce desirable results. Significant technology impediments have prevented the incorporation of silicon carbide into such transistors. These impediments include (1) ion implantation has yet to be fully characterized in silicon carbide; (2) the dopant in p-type silicon carbide (usually aluminum) incorporates itself in the gate oxide causing poor oxide interfacial (silicon dioxide-silicon carbide) properties; and (3) electron mobilities in inversion layer of p-type silicon carbide are very low (10–20 $cm^2/V$).

MOSFETs constructed of silicon carbide are described in a paper entitled "Thin Film Deposition and Microelectronic and Optoelectronic Device Fabrication and Characterization in Monocrystaline Alpha and Delta Silicon Carbide" by Robert F. Davis et al., which appeared in Volume 79, No. 5 of the Proceedings of the IEEE (May 1991). Davis et al. disclose a typical inversion mode MOSFET constructed on a p-type 6H epi layer and having n+ source and drain contacts. This design suffers the drawback that a good quality oxide cannot be grown on the p-type silicon carbide epitaxial layer. The oxide cannot be grown effectively on the epitaxial layer because the p-type silicon carbide incorporates aluminum which interferes with the silicon carbide/oxide interface.

In International Application No. PCT/US92/10210 to Cooper et al., an NVRAM cell design fabricated of silicon carbide is shown describing two separate approaches. The first is a bipolar transistor with a p-n junction diode and the second is a MOS transistor with a MOS capacitator. In the bipolar transistor approach, the effective storage capacitance is made of two reverse biased junctions—one in the storage diode and the second in the reversed biased junction of the bipolar transistor. Both the junctions contribute to the leakage current of the cell. Thus, the total leakage current in the bipolar transistor approach is twice of what it would be in a single junction approach.

In the MOS transistor approach of Cooper et al., the enhancement mode n-channel MOS transistor is made as an inversion mode transistor on p-type silicon carbide substrate with n+ conductivity type source and drain regions. Such a transistor may tend to have a high leakage current and poor transconductance due to high interface state density at the silicon dioxide/p-silicon carbide interface due to the incorporation of aluminum which is used as a dopant in the p-type silicon carbide material. In fact, Cooper et al. discuss on page 19, line 19 that this design offers a sub-threshold leakage current at room temperature for this type of transistor of 1.95 µA. This sub-threshold leakage current value is unacceptable for NVRAM applications. Furthermore, the MOS transistor approach of Cooper et al. utilizes a storage capacitor of MOS-type made on an n+ silicon carbide layer. Such a capacitor will tend to have a high leakage current due to the defects in the n+ silicon carbide layer and also the defects in the underlying p-type silicon carbide substrate.

SUMMARY OF THE INVENTION

We provide a non-volatile random access memory (NVRAM) cell that utilizes a simple, single-transistor DRAM cell configuration. The drawbacks discussed above with reference to presently available enhancement mode nMOS transistors made as inversion mode transistors on p-type silicon carbide substrates with n+ source and drain regions is overcome by the present invention.

The present NVRAM employs an enhancement mode nMOS transistor made as an accumulation mode transistor. The transistor utilizes an n-type silicon carbide channel layer on at least one p-type silicon carbide buffer layer. The channel layer is provided upon a highly resistive silicon carbide substrate. An n+ source contact region and an n+ drain contact region are provided upon the channel layer. This design offers improved leakage characteristics at the silicon dioxide/n silicon carbide interface.

The present NVRAM design also offers leakage current improvements over the above discussed prior art with respect to the capacitor design. In the proposed embodiment, a polysilicon/oxide/metal capacitor is preferably used which has a very low leakage current. Furthermore, this type of capacitor can be stacked on top of the transistor to save area and achieve high cell density. Being an enhancement mode MOSFET, the transistor is turned "off" when no power is applied to the gate terminal. This preserves the memory charge in the storage capacitor. Furthermore, transistors in n-type epitaxial layer on p-type silicon carbide substrate can be easily isolated from each other by mesa etching whereas the inversion mode transistors discussed above cannot be isolated from each other by use of epitaxial layers.

It is preferred to use a non-reentrant (edgeless) gate transistor structure to reduce edge effects. It is further preferred to utilize a polysilicon-dielectric-metal capacitor. This capacitor structure will make more efficient use of space as the capacitor may be stacked on top of the polysilicon gate of the transistor.

6H polytype silicon carbide (alpha type) is preferred for the device, however, any silicon carbide polytype such as 3C, 2H, 4H and 15R may be utilized. Due to the large energy gap of silicon carbide, the generation rate of electron hole pairs is many orders of magnitude lower than that in silicon over a wide temperature range. A low electron hole pair generation rate translates into extremely low leakage currents as a function of temperature. When applied to transistors and a memory array, extremely low leakage currents in silicon carbide lead to extremely long retention times.

Other objects and advantages of the invention will become apparent from a description of certain present preferred embodiments thereof shown in the drawings.

DETAILED DESCRIPTION OF THE PREFERRED EMBODIMENT

Figure 1:
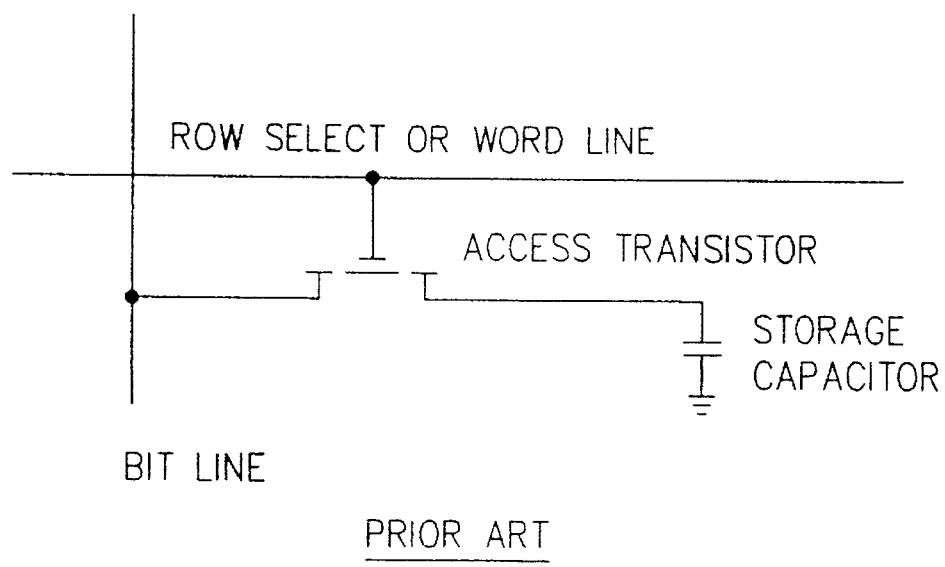
FIG. 1 is a prior art figure depicting the equivalent circuit of a typical DRAM cell.

We provide a true non- volatile random access memory cell that utilizes a single transistor DRAM cell configuration incorporating an enhancement mode nMOS (n-channel) MOS transistor. The transistor is made as an accumulation mode transistor in which an n-type silicon carbide channel layer is provided upon at least one (and preferably two) p-type silicon carbide buffer layers. The channel layer is provided upon a highly resistive silicon carbide substrate. And n+ source and drain contact regions are provided upon the channel layer. A detailed description of the preferred NVRAM cell and transistor is provided below with reference to the Figures. The equivalent circuit of the proposed NVRAM is the same as the equivalent circuit for the typical DRAM cell shown in prior art FIG. 1.

6H silicon carbide has a relatively high band gap of 2.86 electrons volts at room temperature (compared to silicon which has a band gap of 1.12 electron volts). The high band gap of silicon carbide allows the silicon carbide leakage currents which may be caused by Schockly-Reed-Hall pair generation due to the defects in the Semiconductor material to be very small at room temperature. The relatively high band gap of silicon carbide thus results in transistors with low leakage currents.

Figure 2A:
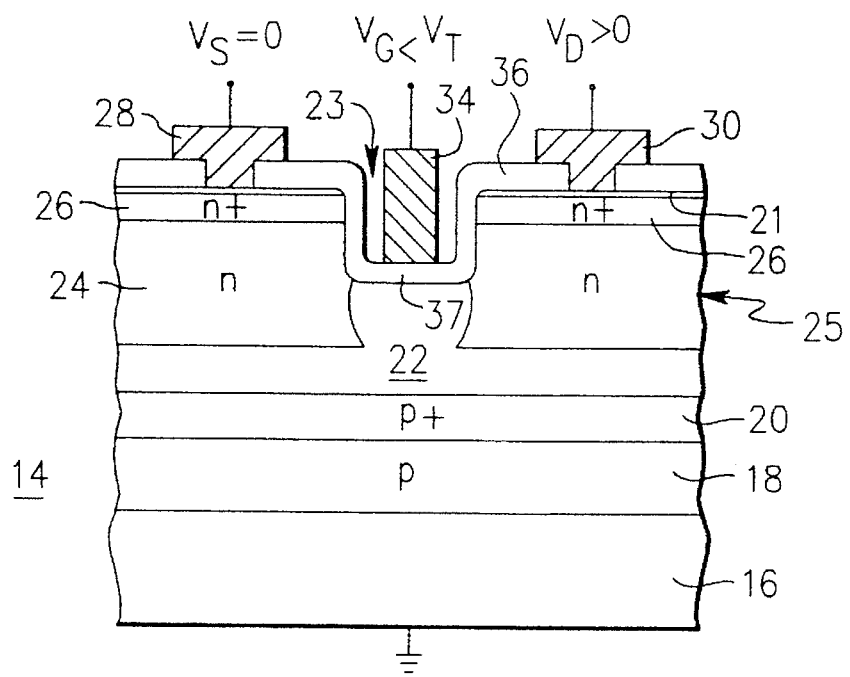
FIG. 2A is a cross sectional view of the first preferred transistor for use in the NVRAM cell showing a depletion region in the channel.
Figure 2B:
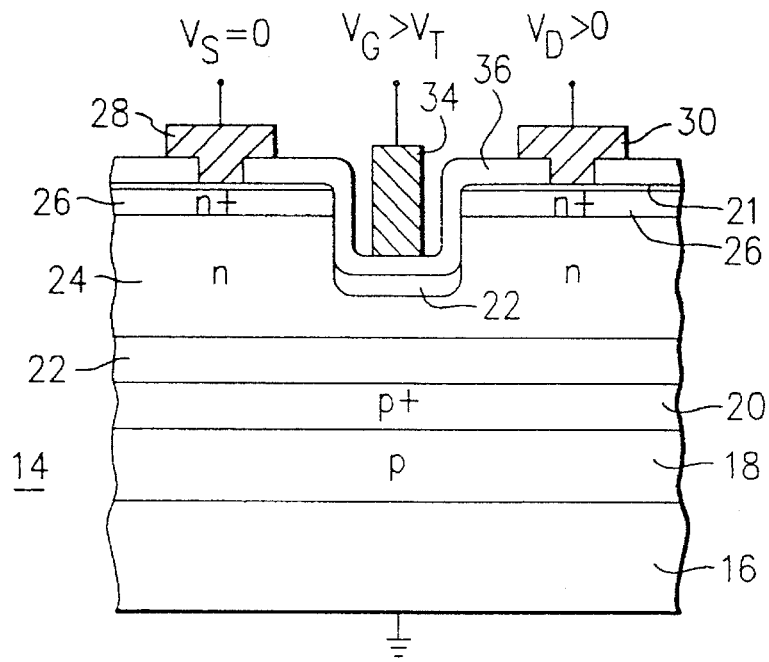
FIG. 2B is a view similar to FIG. 2A in which the channel is partially depleted.
Figure 2C:
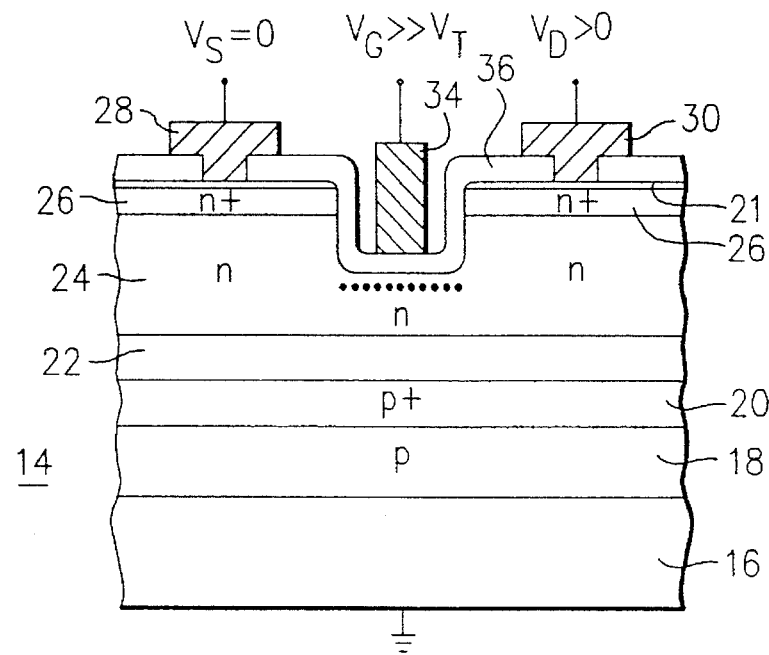
FIG. 2C is a view similar to FIG. 2A in which an accumulation layer has formed in the channel.

The preferred MOSFET 14 which may be utilized in the NVRAM is shown in FIGS. 2A, 2B and 2C. The device is made from a three layer epitaxial system. The transistor 14 is built upon a substrate 16 of silicon carbide. A layer 18 of p conductivity-type silicon carbide is provided upon the substrate 16. A layer 20 of p+ conductivity-type silicon carbide is then preferably provided upon the p layer 18. Layers 18 and 20 are preferably formed by epitaxial growth upon the substrate 16.

Although the preferred MOSFET structure includes substrate 16 and p and p+ layers 18, 20 respectively, the MOSFET may alternatively be comprised of a single p conductivity-type layer provided upon the structure, or of a single substrate/layer that is p conductivity type.

A channel layer 24 of n type silicon carbide is provided upon the p+ layer 20. The preferred MOSFET is a recessed gate MOSFET, thus, the channel layer 24 is constructed as a mesa, having two fingers 25 extending outward generally perpendicular to the substrate. A recess area 23 thereby lies between the two fingers 25. A gate 34, which will be discussed more fully below, is provided within the recess area 23.

Two contact regions 26 of n+ semiconductor are provided upon the channel layer 24 on each side of the gate material 34. Ohmic contacts 21, preferably consisting of nickel, are provided upon the contact regions 26.

Source and drain electrodes 28, 30 are deposited upon and are therefore electrically connected to respective ohmic contacts 21 on each side of the gate electrode 34. Thus, the source electrode 28 is connected to the n+ contact region 26 on one (source) side of the gate material 34, and the drain electrode 30 is connected to the n+ contact region 26 on the other (drain) side of the gate material 34.

A gate oxide 37 is provided directly upon the channel layer 24 in the recess area 23, and a gate material 34 that is preferably made of p+ type polysilicon is provided upon the gate oxide 37. However, other suitable conductive materials, such as metals, may be used. Thus, the gate material 34 is indirectly connected to the channel layer 24. A depletion region 22, in which there are no carrier electrons, is formed in the channel layer 24 between the p type epitaxial layers 18, 20 and the p+ gate material 34. The size of the depletion region 22 varies depending upon the magnitude of the voltage bias applied to the gate 34.

The thickness and doping of the n conductivity-type epitaxial layer are adjusted such that a path between the source and drain through the channel layer 24 is fully depleted at zero bias, as shown in FIG. 2A. This full depletion is due to the work function difference between the p+ doped polysilicon gate material 34 and the n doped silicon carbide substrate. Thus, a depletion region 22 which is depleted of free electrons is formed beneath the gate material 34 between each of the fingers 25. Therefore, electrons cannot flow from the source electrode 28 to the drain electrode 30 through the depletion area 22. The p+ layer 20 lying beneath the n-type channel 23 helps pinch off the channel 23 and also serves to isolate the FET from adjacent devices in an integrated circuit.

Referring next to FIG. 2B, as positive gate bias ($V_G$) is applied, the depletion region 22 beneath the gate 34 reduces. In this manner, a conductive path is formed through the n layer 24, allowing current flow between source and drain electrodes 28, 30 through the channel 24.

For higher positive values of gate bias ($V_G$), as shown in FIG. 2C, an electron accumulation layer is formed in the channel 23 through which most of the current flow travels. The increased positive gate bias will attract electrons (depicted as boldened dots in FIG. 2C) and form an accumulation layer. Once the accumulation layer has been created, resistance is low between the source and the drain allowing conduction therebetween.

Figure 3A:
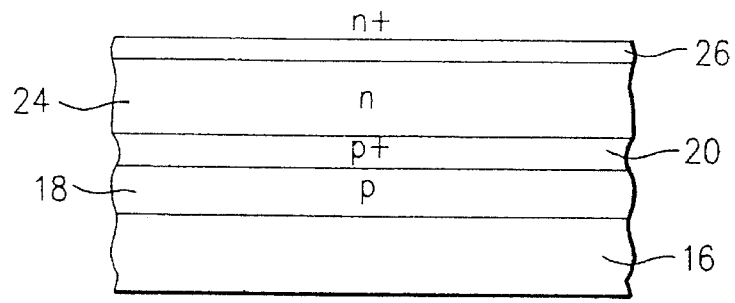
FIG. 3A shows a first step in the preferred process for forming the first preferred transistor and the preferred NVRAM cell.

The fabrication of the preferred MOSFET 14 and of the NVRAM cell which incorporates the preferred MOSFET is. depicted in FIGS. 3A–3H. Referring first to FIG. 3A, a multilayered silicon carbide structure is shown. A semi-insulating substrate 16 fabricated of silicon carbide is provided. The substrate 16 is preferably semi-insulating, having a resistivity of at least 1000 Ohm-cm, and should be fabricated so as to reduce the concentrations of mid-band gap recombination centers. However, the substrate 16 need hot be semi-insulating for the transistor 14 to be functional.

A series of silicon carbide layers are then provided upon the substrate. Preferably, a layer of p type silicon carbide is first provided on the substrate, with a layer of p+ silicon carbide being then provided on the p type layer. The p and p+ layers act as a buffer. Although the preferred MOSFET structure includes substrate 16 and p and p+ layers 18, 20 respectively, the MOSFET may alternatively be comprised of a single p conductivity-type layer provided upon the structure, or of a single substrate/layer that is p conductivity type.

A channel layer 24 of n type silicon carbide is next provided on the p+ layer. Finally, an n+ contact layer 26 of silicon carbide is deposited on the channel layer 24.

Each of the p type, p+ type, n type and n+ type layers are preferably provided by epitaxial growth. The epitaxial layers are grown during chemical vapor deposition (CVD) onto the Substrate 16. The preferred concentrations for the layers areas follows. Substrate 16, which is semi-insulating to p type, is preferably doped at between $10^{16}$ and $10^{19}$ cm$^{-3}$. Layer 18 of p type silicon carbide is preferably doped at between $10^{16}$ and $10^{19}$ cm$^{-3}$. Layer 20 of p+ type silicon carbide is preferably doped at between $10^{17}$ and $10^{19}$ cm$^{-3}$. The n type silicon carbide channel layer 24 is preferably doped at approximately $3\times10^{16}$ to $10^{17}$ cm$^{-3}$, and the n+ silicon carbide contact layer 26 is preferably doped at approximately $10^{18}$ to $10^{20}$ cm$^{-3}$. Epitaxial growth is achieved at approximately 1450° C. from silane and propane Sources, with p type and n type doping being achieved by aluminum and nitrogen dopants, respectively. Instead of forming layers 18, 20, 24 and 26 on the substrate 16 by epitaxial growth, layers 18, 20, 24 and 26 may alternatively be formed by combinations of epitaxial growth and ion implantation.

Figure 3B:
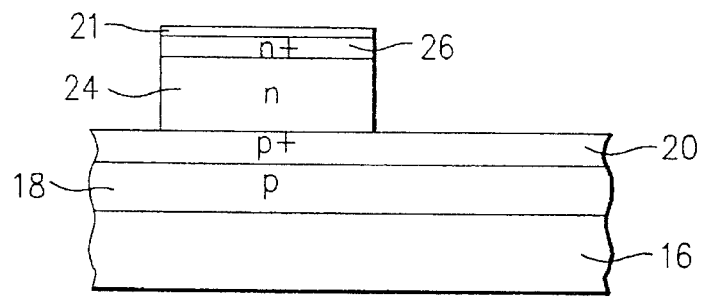
FIG. 3B shows a second step in the preferred process for forming the first preferred transistor and the preferred NVRAM cell.

Referring next to FIG. 3B, the channel layer 24 and contact region 26 are simultaneously shaped and material is removed so that the channel layer 24 and contact region 26 will form a generally rectangular segment of material known as mesa. The channel layer 24 and contact region 26 will preferably be shaped by reactive ion etching. The reactive ion etching is performed by standard means known in the industry, in which a masking material (not shown) such as chrome or nickel is applied in a pattern to those areas in which it is desired that no material be removed. A reactive ion is then directed upon the materials, etching away the unmasked portions.

An ohmic contact layer 21 is then applied upon the contact layer 26. The ohmic contact layer 21 is comprised of a material, preferably nickel, which provides good ohmic contact (i.e., current passes freely in either direction therethrough). Although the ohmic contact layer 21 is preferably applied after the channel layer 24 and contact region 26 are etched, it is understood that the ohmic contact layer 21 may be applied before etching and be shaped by etching as well.

Figure 3C:
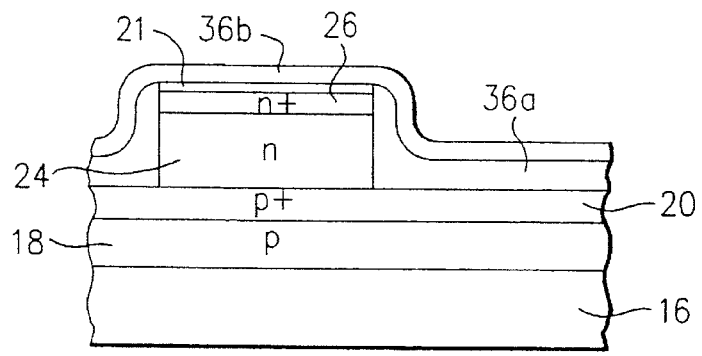
FIG. 3C shows a third step in the preferred process for forming the first preferred transistor and the preferred NVRAM cell.

Referring next to FIG. 3C, an oxide 36, preferably silicon dioxide, is provided on the silicon carbide layers. The oxide 36 is preferably provided in two stages (depicted in FIG. 3C as 36a and 36b). First, a local oxide 36a is thermally grown on top of the p+ layer 20. This local oxide 36a is grown so that it surrounds the sides of the channel layer 24 and contact region 26, as can be seen in FIG. 3C. The oxide 36 may be either wet or dry grown at approximately 1100° C. to 1300° C. Next, oxide and or nitride 36b (which is preferably silicon dioxide) is deposited over the previous oxide 36a as well as the n+ contact region 26. Thus, once the oxide 36 has been provided, the entire structure is encapsulated by silicon dioxide.

Figure 3D:
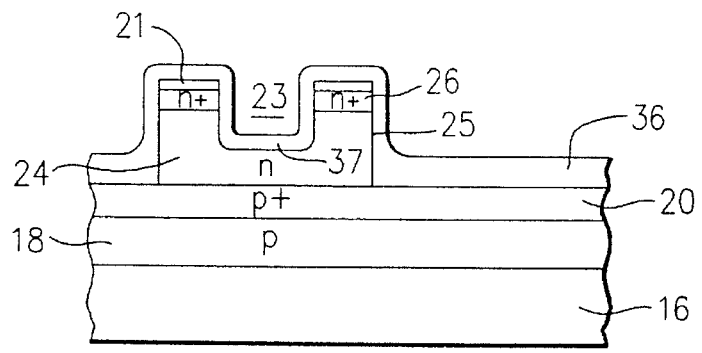
FIG. 3D shows a fourth step in the preferred process for forming the first preferred transistor and the preferred NVRAM cell.

Next, as shown in FIG. 3D, a groove or recess 23 is formed through the oxide 36 and through the contact region 26 and channel layer 24. The recess 23 is preferably formed by reactive ion etching, described above. Once the layers 24, 26 have been shaped by the etching process, the channel region 24 has the shape of a mesa, in which the channel layer 24 has two protrusions or fingers 25 extending outward, generally perpendicular to the substrate 16, with fingers 25 being separated by recess 23. At this point, the semiconductor material surrounding the recess 23 is exposed, i.e., does not have any oxide 36 thereupon. The contact region 26 has been divided by the etching process and is now two separate regions 26, each provided upon a respective finger 25 of the channel layer 24.

Portions of the channel layer 24 and contact regions 26 surrounding the recess 23 are then provided with a thermal gate oxide layer 37. Gate oxide 37 is preferably silicon dioxide and may be either wet or dry grown at approximately 1100° C. to 1300° C.

Figure 3E:
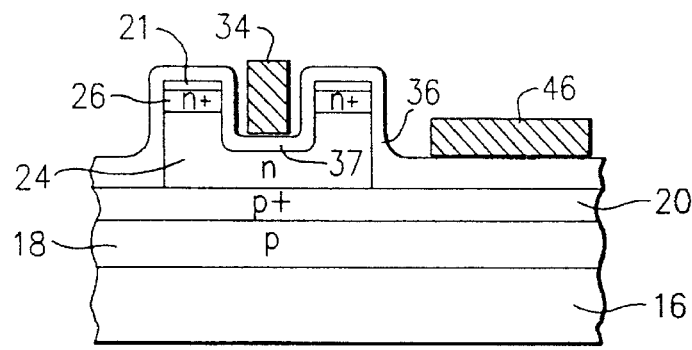
FIG. 3E shows a fifth step in the preferred process for forming the first preferred transistor and the preferred NVRAM cell.

Next, as can be seen in FIG. 3E, polysilicon is deposited and patterned upon oxide 36 within recess 23 and at a selected distance from the channel region 24. The polysilicon deposited in the recess 23 will form the gate while the polysilicon deposited exterior to the channel region 24 will form a first capacitor plate 46 for the capacitor 41 of the preferred NVRAM cell. The polysilicon deposited in the gate region and the capacitor region may be deposited simultaneously or in turn. The polysilicon is doped p+ conductivity type.

Figure 3F:
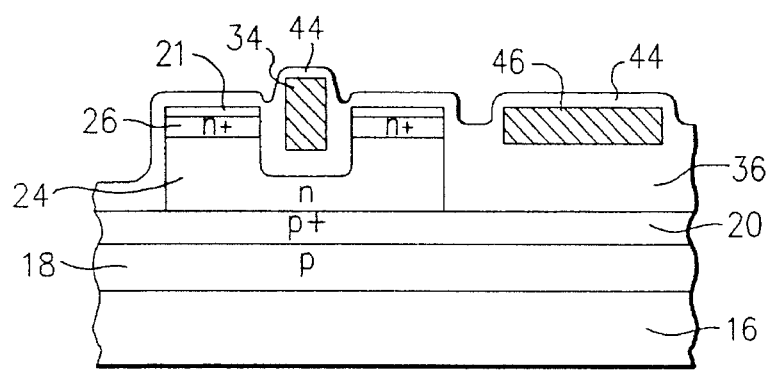
FIG. 3F shows a sixth step in the preferred process for forming the first preferred transistor and the preferred NVRAM cell.

Referring next to FIG. 3F, the entire structure is then encapsulated by a dielectric 44. The dielectric is preferably oxide-nitride-oxide (ONO). By being provided atop the polysilicon first capacitor plate 46, the dielectric layer 44 will comprise the middle layer of the capacitor 41. The remainder of the dielectric layer 44 deposited upon the field oxide layer 36 and upon the gate polysilicon 34, serves to electrically isolate the cell.

Figure 3G:
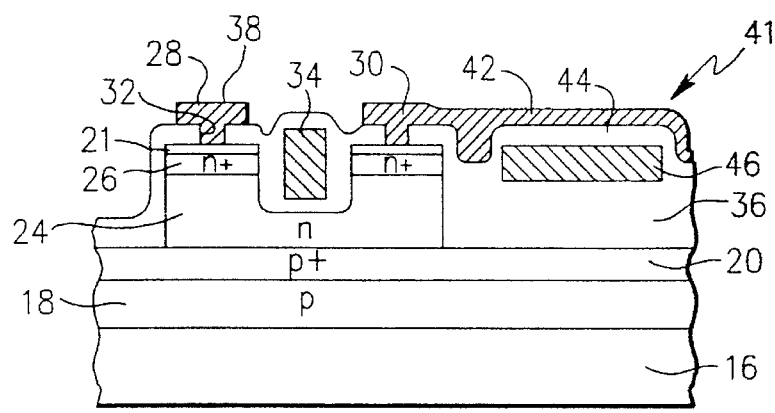
FIG. 3G shows a seventh step in the preferred process for forming the first preferred transistor and the preferred NVRAM cell.

Referring next to FIG. 3G, portions of the dielectric layer 44 and oxide layer 36 are removed providing contact openings 32 therethrough. Thus, a portion of the ohmic contacts 21 lying upon the contact regions 26 are uncovered and are open. The dielectric/oxide layer may be removed by reactive ion etching described above.

A metal such as aluminum is then deposited selectively upon the structure so that metal fills the contact access openings 32 forming source electrode 28 and drain electrode 30. The metal is further deposited upon the structure so that a continuous stretch of metal forming the bit line 38 extends from the source electrode 28. In this way the bit line 38 and the source are electrically connected. The metal is further deposited Such that a continuous portion of metal extends from drain electrode 30 to atop the dielectric layer 44 upon the first capacitor plate 46. This segment of metal forms the second capacitor plate 42.

The metal may be selectively deposited using a metal liftoff technique in which a photo resist material is applied upon the structure at every location in which it is not desired to have the metal deposited. A layer of metal is then applied over the entire structure and a solvent is applied to the photo resist dissolving the photo resist and carrying away metal which had been applied on the photo resist.

Figure 3H:
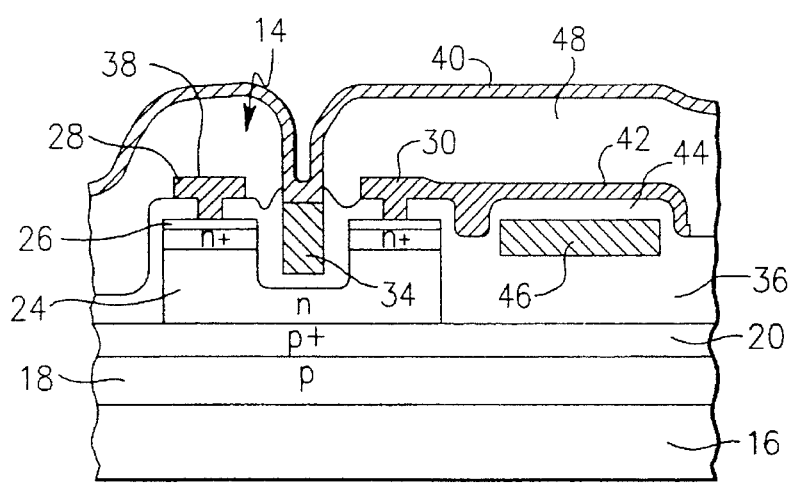
FIG. 3H shows an eighth step in the preferred process for forming the first preferred transistor and the preferred NVRAM cell.

As can be seen in FIG. 3H, the structure is then encapsulated with a dielectric 48. Dielectric 48 is preferably deposited silicon dioxide. Portions of the dielectric are then selectively removed, so that the gate 34 may be exposed. The dielectric may be removed by any means such as reactive ion etching described above.

A metal word line 40 is deposited upon the structure so as to provide a layer upon the dielectric 48 as well as contacting the gate 34. In this way, the word line 40 and the gate 34 are electrically connected.

Thus, the MOSFET 14 for use in the NVRAM is accumulation mode and enhancement drive having an n-type channel and a p+ type doped polysilicon gate 34. A quality oxide may therefore be grown on the n-type channel while providing favorable current drive and leakage current characteristics.

P+ polysilicon is rarely used in MOSFETs. This is because the polysilicon is made p+ typically by doping the polysilicon with boron, and boron tends (when materials such as silicon are used) to diffuse through the oxide. Once the boron diffuses into the oxide, it may travel into the underlying semiconductor material. If the silicon is n-type, the boron may make the material p-type and if the silicon is p-type, the boron will tend to make it more heavily doped p-type. This will not be a problem with silicon carbide because the boron is not active when in contact with the silicon carbide and thus does not effect channel doping.

Figure 5:
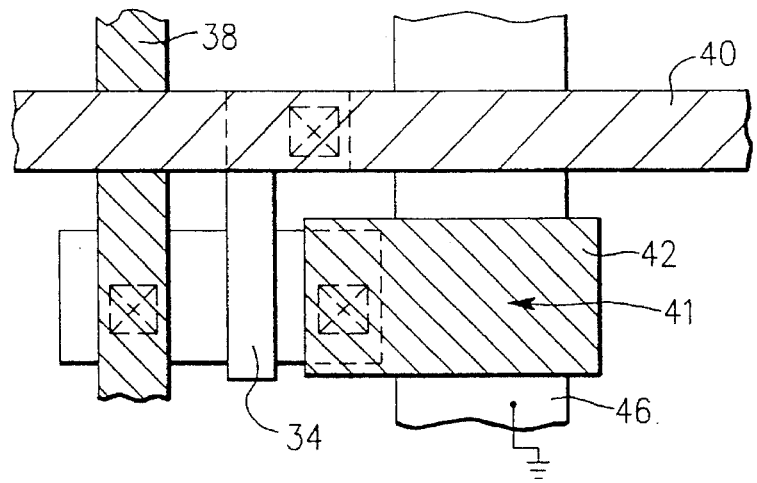
FIG. 5 is a cell layout of a first preferred NVRAM cell.

Referring next to FIGS. 3H and 5, the preferred MOSFET is incorporated in a single transistor capacitor random access memory cell 12. Preferably a polysilicon/oxide/metal capacitor is employed which offers very low leakage currents. The cell may be constructed as follows.

A conductive bit line 38 is connected to the Source electrode 28. The bit line 38 is preferably made of aluminum. A section of conductive material which forms the upper plate 42 of the cell capacitor 41 is connected to drain electrode 30. Capacitor plate 42 is also preferably made of aluminum, and is deposited upon the cell at the same time as the bit line is deposited. A field oxide 36 is provided atop of the p+ layer 20. A portion of the field oxide also lies atop of a portion of both the source n+ region 26 and drain n+ region 26. However, the gate oxide 37 and field oxide 36 do not completely encompass n+ wells 26, but rather leave space by which the source electrode 28 and drain electrode 30 may directly contact n+ wells 26, respectively Lying upon the field oxide 36 is a first capacitor plate 46, which is preferably fabricated of polysilicon. The second capacitor plate 42 preferably extends outward over the first capacitor plate 46 leaving a planar space therebetween. A Layer of dielectric material 44 is provided between the first capacitor plate 46 and the second capacitor plate 42. A layer of dielectric material 48 is then provided over the exposed cell components (i.e., the second capacitor plate 42, the gate oxide 37 and the bit line 38), except for the gate electrode 34. A conductive word line 40 is then connected to the gate electrode 34.

Figure 4:
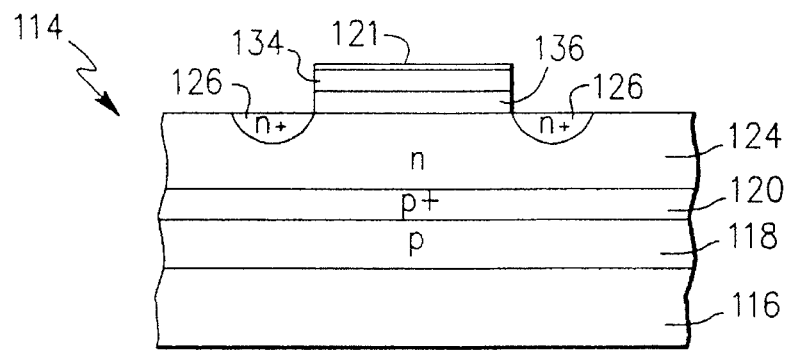
FIG. 4 is a cross sectional view of a second preferred transistor for use in the NVRAM cell.

Although a recessed gate MOSFET is preferred, a planar MOSFET 114 may also be utilized as is shown in FIG. 4. The planar gate MOSFET 114 is similar to recessed gated MOSFET 14 in that a highly resistive substrate 116 is provided With buffer layers of p and p+ type silicon carbide 118, 120 thereupon. As is the case for MOSFET 14, planar gate MOSFET 114 may instead utilize a single p type layer rather than p layer 118 and p+ layer 120. A channel region 124 is then provided upon p+ layer 120. Layers 118, 120, 124 are preferably provided by epitaxial growth upon substrate 116 as is discussed above for the recessed gate MOSFET embodiment. Source and drain contact wells of n+ silicon carbide are provided upon the channel layer 124. The wells 126 are preferably provided by ion implantation into the n type channel layer 124. The wells 126 are spaced a selected distance apart upon channel layer 124. Provided upon channel layer 124 between the two contact wells 126 is a layer of a gate oxide 136. The gate oxide 136, which is preferably silicon dioxide, may be deposited or grown upon channel layer 124. A gate material 134 is then deposited upon the oxide layer 136. Gate layer 134 is preferably polysilicon. A layer of ohmic Contact material 121 is then provided upon gate material 134.

Figure 6:
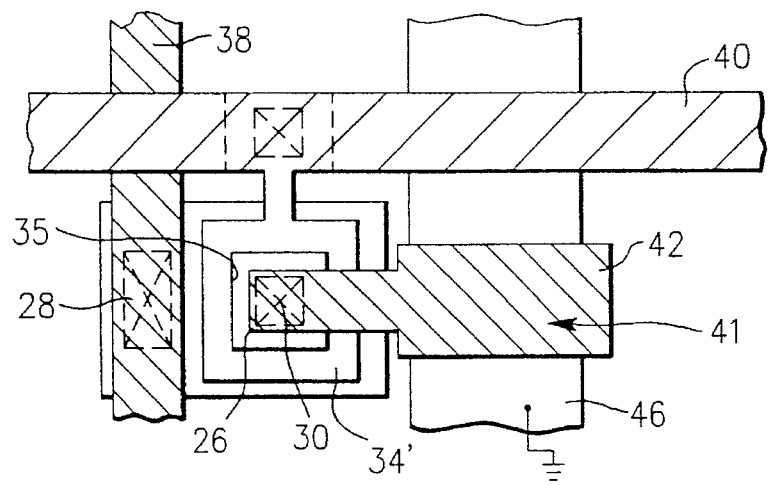
FIG. 6 is a cell layout of a second preferred NVRAM cell utilizing an edgeless transistor.

To reduce edge effects, a non-reentrant structure transistor (also known as an edgeless transistor) is employed. FIG. 6 shows the cell layout of the NVRAM cell having an edgeless transistor configuration. Edgeless transistors are known in the art. The edgeless transistor removes other sources of leakage currents that could exist. The edgeless transistor is characterized by a generally rectangular or square picture frame shaped gate 34'. Rectangular gate 34' therefore has a generally square or rectangular opening 35 therethrough. The rectangular gate 34' surrounds the drain contact region 26 and drain electrode 30, as is shown in the figure. The drain contact region 26 and electrode 30 extend outward through opening 35. This structure, coupled with the properties of silicon carbide, provide a low leakage current. Integrating this transistor into the DRAM memory cell structure leads to virtual non-volatile RAM. Thus, silicon carbide can hold charge indefinitely at room temperature.

While certain present preferred embodiments have been shown and described, it is distinctly understood that the invention is not limited thereto but may be otherwise embodied within the scope of the following claims.

We claim:

1. A nonvolatile random access memory cell, comprising:
   a bit line for writing information to storage when a potential is applied to the bit line;
   means for storing charge; and
   an accumulation mode MOSFET for connecting the charge storage means to the bit line, wherein the MOSFET is comprised of:
   (i) a semi-insulating silicon carbide substrate;
   (ii) at least one layer of p type silicon carbide provided upon the substrate;
   (iii) a channel layer of n type silicon carbide provided on the at least one layer of p type silicon carbide;
   (iv) two contact regions of n+ type silicon carbide, each contact region being spacedly provided upon the channel layer, such that the contact regions are separated a selected distance apart;
   (v) a layer of an oxide provided upon the channel region of the n type channel layer between the two contact regions; and
   (vi) a gate of conductive material provided upon the layer of the oxide.

2. The memory cell of claim 1 wherein the MOSFET has a planar gate, such that the contact regions are wells provided in the channel layer.

3. The memory cell of claim 1 wherein the MOSFET has a recessed gate, such that the channel layer is constructed as a mesa, such that each contact region is a layer of n+ silicon carbide disposed upon a finger of the mesa that extends outward from the substrate.

4. The memory cell of claim 1 wherein the substrate has a resistivity of at least 1000 Ohm-cm.

5. The memory cell of claim 1 wherein the at least one layer of p type silicon carbide is further comprised of a layer of p+ silicon carbide provided upon a layer of p type silicon carbide.

6. The memory cell of claim 5 wherein at least one of the p+ layer and the p layer are formed by epitaxial growth onto the substrate.

7. The memory cell of claim 1 wherein the channel layer is formed by epitaxial growth on the at least one layer of p type silicon carbide.

8. The memory cell of claim 1 wherein the contact regions are formed on the channel layer by one of epitaxial growth and ion implantation.

9. The memory cell of claim 1 wherein the means for storing charge is a capacitor.

10. The memory cell of claim 9 wherein the capacitor is formed of a layer of at least one of an oxide and a nitride provided between two layers of conductive material.

11. The memory cell of claim 1 further comprising a word line coupled to the gate of the MOSFET, wherein when voltage is simultaneously applied to the word line and the bit line, charge is transferred through the MOSFET in cooperation with the charge storing means.

12. The memory cell of claim 1 wherein the gate is fabricated of at least one of polysilicon, p+ type polysilicon and a metal.

13. The memory cell of claim 1 wherein the layer of oxide is comprised of silicon dioxide.

14. The memory cell of claim 1 wherein the accumulation mode MOSFET has a non-reentrant transistor configuration.

15. An accumulation mode MOSFET comprised of:
   (a) a semi-insulating, silicon carbide substrate;
   (b) at least one layer of p type silicon carbide provided upon the substrate;
   (c) a channel layer of n type silicon carbide provided on the at least one layer of p type silicon carbide;
   (d) two contact regions of n+ type silicon carbide, each contact region being spacedly provided upon opposed sides of the channel layer, such that the contact regions are separated a selected distance apart;
   (e) a layer of oxide provided upon the channel layer between the two contact regions; and
   (f) a gate of conductive material provided upon the layer of oxide.

16. The MOSFET of claim 15 wherein the gate is fabricated of at least one of polysilicon, p+ type polysilicon and a metal.

17. The MOSFET of claim 15 wherein the MOSFET has a planar gate, such that the contact regions are wells provided in the channel layer.

18. The MOSFET of claim 15 wherein the MOSFET has a recessed gate, such that the channel layer is constructed as a mesa, such that each contact region is disposed upon a finger of the mesa that extends outward from the substrate.

19. The MOSFET of claim 15 wherein the substrate has a resistivity of at least 1000 Ohm-cm.

20. The MOSFET of claim 15 wherein the at least one layer of p type silicon carbide is further comprised of a layer of p+ silicon carbide provided upon the p layer.

21. The MOSFET of claim 20 wherein at least one of the p+ layer and the p layer are formed by ion implantation into the substrate.

22. The MOSFET of claim 20 wherein at least one of the p+ layer and the p layer are formed by epitaxial growth onto the substrate.

23. The MOSFET of claim 15 wherein the channel layer is formed by epitaxial growth on the at least one layer of p type silicon carbide.

24. The MOSFET of claim 15 wherein the silicon carbide is one of 3C, 2H, 4H, 6H and 15R polytypes.

* * * * *